(12) United States Patent
Bae et al.

(10) Patent No.: US 9,240,443 B2
(45) Date of Patent: Jan. 19, 2016

(54) PROCESS OF PREPARING A GAP FILLER AGENT, A GAP FILLER AGENT PREPARED USING SAME, AND A METHOD FOR MANUFACTURING SEMICONDUCTOR CAPACITOR USING THE GAP FILLER AGENT

(71) Applicants: Jin-Hee Bae, Uiwang-si (KR); Han-Song Lee, Uiwang-si (KR); Taek-Soo Kwak, Uiwang-si (KR); Go-Un Kim, Uiwang-si (KR); Bo-Sun Kim, Uiwang-si (KR); Sang-Kyun Kim, Uiwang-si (KR); Yoong-Hee Na, Uiwang-si (KR); Eun-Su Park, Uiwang-si (KR); Jin-Woo Seo, Uiwang-si (KR); Hyun-Ji Song, Uiwang-si (KR); Sang-Hak Lim, Uiwang-si (KR); Wan-Hee Lim, Uiwang-si (KR); Seung-Hee Hong, Uiwang-si (KR); Byeong-Gyu Hwang, Uiwang-si (KR)

(72) Inventors: Jin-Hee Bae, Uiwang-si (KR); Han-Song Lee, Uiwang-si (KR); Taek-Soo Kwak, Uiwang-si (KR); Go-Un Kim, Uiwang-si (KR); Bo-Sun Kim, Uiwang-si (KR); Sang-Kyun Kim, Uiwang-si (KR); Yoong-Hee Na, Uiwang-si (KR); Eun-Su Park, Uiwang-si (KR); Jin-Woo Seo, Uiwang-si (KR); Hyun-Ji Song, Uiwang-si (KR); Sang-Hak Lim, Uiwang-si (KR); Wan-Hee Lim, Uiwang-si (KR); Seung-Hee Hong, Uiwang-si (KR); Byeong-Gyu Hwang, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 14/144,738

(22) Filed: Dec. 31, 2013

(65) Prior Publication Data

US 2014/0187017 A1    Jul. 3, 2014

(30) Foreign Application Priority Data

Dec. 31, 2012 (KR) .................. 10-2012-0158681
Jun. 27, 2013 (KR) .................. 10-2013-0074682

(51) Int. Cl.
*C08G 77/00* (2006.01)
*H01L 49/02* (2006.01)
*H01L 21/02* (2006.01)

(52) U.S. Cl.
CPC ............... *H01L 28/92* (2013.01); *C08G 77/00* (2013.01); *H01L 21/02222* (2013.01); *H01L 21/02282* (2013.01); *H01L 21/02326* (2013.01)

(58) Field of Classification Search
None
See application file for complete search history.

(56) References Cited

U.S. PATENT DOCUMENTS 5,322,913 A * 6/1994 Blum et al. .................. 528/15

(Continued)

FOREIGN PATENT DOCUMENTS

| JP | 10-046108 A | 2/1998 |
| JP | 10-194826 A | 7/1998 |

(Continued)

OTHER PUBLICATIONS

Search Report mailed Feb. 13, 2015 in corresponding Taiwanese Patent Application No. 102148583.

*Primary Examiner* — Robert S Loewe
(74) *Attorney, Agent, or Firm* — Lee & Morse, P.C.

(57) ABSTRACT

A method of preparing a gap filler agent includes adding a halosilane to a basic solvent, and, to the basic solvent and the halosilane, adding ammonia in an amount of about 50 to about 70 parts by weight based on 100 parts by weight of the halosilane at a rate of about 1 g/hr to about 15 g/hr.

16 Claims, 3 Drawing Sheets

(56) References Cited

U.S. PATENT DOCUMENTS

| | | |
|---|---|---|
| 6,329,487 B1 | 12/2001 | Abel et al. |
| 6,767,641 B1 | 7/2004 | Shimizu et al. |
| 8,058,711 B2 | 11/2011 | Lim et al. |
| 2003/0164113 A1* | 9/2003 | Suzuki ..................... 106/18.32 |
| 2005/0027089 A1* | 2/2005 | Shimizu et al. ................. 528/38 |
| 2005/0218803 A1 | 10/2005 | Takeuchi et al. |
| 2005/0279255 A1* | 12/2005 | Suzuki et al. ............ 106/287.11 |
| 2007/0259106 A1* | 11/2007 | Shimizu et al. ............ 427/126.1 |
| 2010/0210808 A1 | 8/2010 | Jeong |
| 2010/0234540 A1* | 9/2010 | Ozaki ......................... 525/474 |
| 2013/0178595 A1* | 7/2013 | Yang et al. ..................... 528/27 |
| 2013/0220682 A1* | 8/2013 | Iyer et al. ..................... 174/255 |
| 2013/0224481 A1* | 8/2013 | Kwak et al. .................. 428/336 |
| 2014/0106576 A1* | 4/2014 | Morita et al. ................. 438/787 |

FOREIGN PATENT DOCUMENTS

| | | |
|---|---|---|
| JP | 2001-308090 A | 11/2001 |
| JP | 2005-285659 A | 10/2005 |
| KR | 10-2006-0002786 A | 1/2006 |
| KR | 10-2007-0038582 A | 4/2007 |
| KR | 10-0909215 B1 | 7/2009 |
| KR | 10-2011-0062158 A | 6/2011 |
| KR | 10-1056838 B1 | 8/2011 |
| KR | 10-2012-0066389 A | 6/2012 |
| TW | 201125899 A1 | 8/2011 |

* cited by examiner

PROCESS OF PREPARING A GAP FILLER AGENT, A GAP FILLER AGENT PREPARED USING SAME, AND A METHOD FOR MANUFACTURING SEMICONDUCTOR CAPACITOR USING THE GAP FILLER AGENT

CROSS-REFERENCE TO RELATED APPLICATIONS

Korean Patent Application No. 10-2012-0158681, filed on Dec. 31, 2012, in the Korean Intellectual Property Office, and entitled: "PROCESS OF PREPARING A GAP FILLER AGENT, A GAP FILLER AGENT PREPARED USING SAME, AND A METHOD FOR MANUFACTURING SEMICONDUCTOR CAPACITOR USING THE GAP FILLER AGENT," is incorporated by reference herein in its entirety.

Korean Patent Application No. 10-2013-0074682, filed on Jun. 27, 2013, in the Korean Intellectual Property Office, and entitled: "PROCESS OF PREPARING A GAP FILLER AGENT, A GAP FILLER AGENT PREPARED USING SAME, AND A METHOD FOR MANUFACTURING SEMICONDUCTOR CAPACITOR USING THE GAP FILLER AGENT," is incorporated by reference herein in its entirety.

BACKGROUND

1. Field

Embodiments relate to a method of preparing a gap filler agent, a gap filler agent prepared using the same, and a method for manufacturing a semiconductor capacitor using a gap filler agent.

2. Description of the Related Art

Semiconductor devices may include features variously disposed on a substrate. During fabrication of a semiconductor device, certain features of the device may be formed by depositing, and subsequently removing, one or more layers of materials.

SUMMARY

Embodiments are directed to a method of preparing a gap filler agent, the method including adding a halosilane to a basic solvent, and, to the basic solvent and the halosilane, adding ammonia in an amount of about 50 to about 70 parts by weight based on 100 parts by weight of the halosilane at a rate of about 1 g/hr to about 15 g/hr.

The ammonia may be added at a rate of about 2 g/hr to about 9 g/hr.

The ammonia may be added at a rate of about 3 g/hr to about 7 g/hr.

The halosilane may include one or more of $RSiX_3$, $R_2SiX_2$, or $R_3SiX$. Each R may be independently selected from hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, and a combination thereof. At least one R of the halosilane may be hydrogen. Each X may independently be a halogen atom.

The basic solvent may have a basic amine group and may include one or more of trimethylamine, dimethylethylamine, diethylmethylamine, triethylamine, pyridine, picoline, dimethylaniline, trimethylphosphine, dimethylethylphosphine, methyldiethylphosphine, triethylphosphine, trimethylarsine, trimethylstibine, or triazine.

The gap filler agent may include a hydrogenated polysilazane formed from the halosilane, and the hydrogenated polysilazane may include a moiety represented by the following Chemical Formula 1:

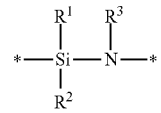

[Chemical Formula 1]

In Chemical Formula 1, $R^1$ to $R^3$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof.

The hydrogenated polysilazane may include a moiety represented by the following Chemical Formula 3 at a terminal end in an amount of about 15 to about 35% based on the total amount of Si—H bonds in the hydrogenated polysilazane structure:

*—$SiH_3$.    [Chemical Formula 3]

The hydrogenated polysilazane may have a weight average molecular weight (Mw) of about 1,000 to about 10,000.

The gap filler agent may include a hydrogenated polysiloxazane formed from the halosilane, and the hydrogenated polysiloxazane may include a moiety represented by the following Chemical Formula 1 and a moiety represented by the following Chemical Formula 2:

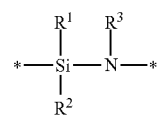

[Chemical Formula 1]

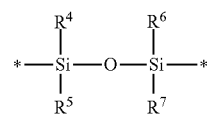

[Chemical Formula 2]

In Chemical Formulae 1 and 2, $R^1$ to $R^7$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof.

The hydrogenated polysiloxazane may include a moiety represented by the following Chemical Formula 3 at a terminal end in an amount of about 15 to about 35% based on the total amount of Si—H bonds in the hydrogenated polysiloxazane structure:

$$*—SiH_3. \qquad \text{[Chemical Formula 3]}$$

The hydrogenated polysiloxazane may have a weight average molecular weight (Mw) of about 1,000 to about 10,000.

The hydrogenated polysiloxazane may have an oxygen content of about 0.2 to about 3 wt %.

The method may further include removing a halogen ammonium salt generated from the halosilane, and polymerizing the halogen ammonium salt to provide a hydrogenated polysilazane.

A predetermined amount of water may be included in the basic solvent, and the method may further include removing a halogen ammonium salt generated from the halosilane, and polymerizing the halogen ammonium salt to provide a hydrogenated polysiloxazane.

Embodiments are also directed to a gap filler agent prepared by a method according to an embodiment.

The gap filler agent may have a shrinkage ratio of film thickness of less than about 15% before and after heating dry on a hot plate at about 150° C. for about 3 minutes.

Embodiments are also directed to a method of manufacturing a semiconductor capacitor, the method including providing a mold having a gap on a semiconductor substrate, providing a conductive layer on the semiconductor substrate and the mold, coating a gap filler agent on the gap and the conductive layer to provide a filler layer, heat-treating the filler layer, developing a part of the filler layer to provide a filler pattern filled in the gap, removing a part of the conductive layer to separate a plurality of the first electrodes, removing the mold and the filler pattern, providing a dielectric layer on the first electrode, and providing a second electrode on the dielectric layer. The gap filler agent may be prepared by a method according to an embodiment.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
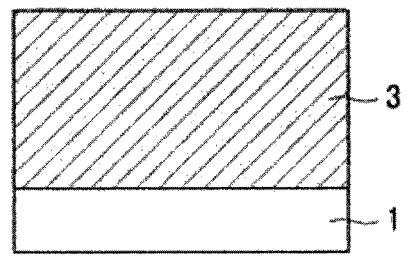
FIGS. 1 to 9 illustrate cross-sectional views of stages in a method of manufacturing a semiconductor capacitor according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout.

As used herein, when a definition is not otherwise provided, "substituted" refers to one substituted with at least one substituent selected from a halogen atom (F, Cl, Br, or I), a hydroxy group, a nitro group, a cyano group, an imino group (=NH, =NR, R is a C1 to C10 alkyl group), an amino group (—NH$_2$, —NH(R'), —N(R")(R'"), wherein R' to R'" are independently a C1 to C10 alkyl group), an amidino group, a hydrazine group, a hydrazone group, a carboxyl group, a substituted or unsubstituted C1 to C30 alkyl group, a substituted or unsubstituted C6 to C30 aryl group, a substituted or unsubstituted C3 to C30 cycloalkyl group, a substituted or unsubstituted C3 to C30 heteroaryl group, and a substituted or unsubstituted C2 to C30 heterocycloalkyl group, instead of at least one hydrogen of a functional group.

As used herein, when a definition is not otherwise provided, the prefix 'hetero' may refer to one including 1 to 3 heteroatoms selected from N, O, S, and P.

In addition, in the specification, the mark "*" refers to where something is connected with the same or different atom or chemical formula.

Hereinafter, a method of preparing a semiconductor gap filler agent according to an example embodiment is described.

A method of preparing a semiconductor gap filler agent according to an example embodiment includes a method of preparing hydrogenated polysilazane.

In an example embodiment, the hydrogenated polysilazane includes a moiety represented by the following Chemical Formula 1:

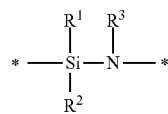

[Chemical Formula 1]

According to the present example embodiment, in the above Chemical Formula 1, $R^1$ to $R^3$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof.

Generally, hydrogenated polysilazane may be prepared by the various methods, e.g., using a reaction between a halosilane and ammonia. The method of preparing a hydrogenated polysilazane by reacting halosilane with ammonia may include injecting halosilane in a basic solvent, adding ammonia thereto and reacting the same, removing a halogen ammonium salt generated therefrom, and polymerizing the same to provide a hydrogenated polysilazane having the above chemical formula.

A method of preparing a gap filler agent according to an example embodiment includes: adding a halosilane to a basic solvent, and adding ammonia in an amount of about 50 to about 70 parts by weight based on 100 parts by weight of the halosilane at a rate of about 1 g/hr to about 15 g/hr. In an implementation, the ammonia may be added at a rate of about 2 g/hr to about 9 g/hr, e.g., at a rate of about 3 g/hr to about 7 g/hr.

When a silica film is manufactured by the gap filler agent including hydrogenated polysilazane obtained by adding ammonia at the above rate, uniform film thickness in the center and at the edges of the silica film and remarkably decreased shrinkage ratio after performing the oxidation reaction at a high temperature may be obtained, compared to the case by using a gap filler agent including hydrogenated polysilazane obtained by adding ammonia at the faster rate than the above rate.

Other processes, i.e., except the addition rate of ammonia described above, may be substantially same as in a general method of preparing a hydrogenated polysilazane using halosilane and ammonia.

For example, the method of preparing a gap filler agent may include: slowly injecting halosilane into a basic solvent, wherein the basic solvent is maintained at a temperature of about 5° C. before injecting the halosilane; adding ammonia in an amount of about 50 to about 70 parts by weight based on 100 parts by weight of the halosilane at the above rate while agitating the mixture; and removing halogenated ammonium salt from the mixture after injecting dry nitrogen into the reactor and removing ammonia remained in the reactor.

The removing the salt may be performed by filtering the same using a TEFLON (tetrafluoroethylene) filter or the like. The solvent of the filtrate (after being filtered) may be replaced with an inert solvent such as an aliphatic hydrocarbon, an aromatic hydrocarbon, etc., to adjust the solid concentration, and added with a basic solvent again and polymerized at about 80° C. to about 120° C. to synthesize a hydrogenated polysilazane. By adjusting the reaction time or the like, the molecular weight of hydrogenated polysilazane may be appropriately controlled.

When completing the polymerization, the method of replacing the solvent with an inert solvent may be repeated using an evaporator or the like to control the solid concentration, and the salt may be removed by a filter so that the hydrogenated polysilazane may be obtained.

The basic solvent may be a solvent having basic amine group, or a mixed solvent thereof, and may be, e.g., trimethylamine, dimethylethylamine, diethylmethylamine, triethylamine, pyridine, picoline, dimethylaniline, trimethylphosphine, dimethylethylphosphine, methyldiethylphosphine, triethylphosphine, trimethylarsine, trimethylstibine, triazine, or a combination thereof. For example, the basic solvent may be selected from pyridine, triazine, triethylamine, and a combination thereof. In an implementation, the basic solvent may be pyridine. When the pyridine is used as the basic solvent, generating a salt with halosilane may be fast, and cost may be reduced.

According to the present example embodiment, the halosilane is a compound including a Si—H bond. The halosilane may include one or more of $RSiX_3$, $R_2SiX_2$, or $R_3SiX$. In an implementation, in the $RSiX_3$, $R_2SiX_2$, and $R_3SiX$, each R is independently selected from hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, and a combination thereof, provided that at least one R is hydrogen, i.e., $HSiX_3$, $RHSiX_2$, and $R_2HSiX$. In an implementation, each X is independently a halogen atom.

The halosilane may be, e.g., dichlorosilane, methyl dichlorosilane, ethyl dichlorosilane, ethyl diiodosilane, ethyl difluorosilane, dichloro monofluorosilane, propyl dibromosilane, isopropyl dichlorosilane, isobutyl dichlorosilane, isoamyl dichlorosilane, benzyl dichlorosilane, propenyl dichlorosilane, naphthyl dichlorosilane, phenyldichlorosilane, diphenyl chlorosilane, methyl ethyl chlorosilane, vinyl methyl chlorosilane, phenyl methyl chlorosilane, dibenzyl chlorosilane, p-chlorophenylmethyl chlorosilane, n-hexyl dichlorosilane, cyclohexyl dichlorosilane, dicyclohexylchlorosilane, di-isobutyl chlorosilane, p-tolyl dichlorosilane, di-p-tolyl chlorosilane, p-styryl dichlorosilane, ethynyl dichlorosilane, or a combination thereof.

In another example embodiment, the semiconductor gap filler agent may be a hydrogenated polysiloxazane composition including the moiety represented by above Chemical Formula 1 and further including a moiety represented by the following Chemical Formula 2. According to the present example embodiment, the gap filler agent may be prepared under the presence of a predetermined amount of water together with the basic solvent in a reactor. Thus, the gap filler agent prepared by water in the basic solvent or water spontaneously present in the reactor may include hydrogenated polysiloxazane further including a moiety represented by the following Chemical Formula 2:

[Chemical Formula 2]

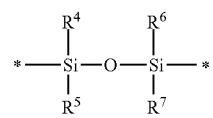

According to the present example embodiment, $R^4$ to $R^7$ of the above Chemical Formula 2 are the same as $R^1$ to $R^3$ of the above Chemical Formula 1.

According to the present example embodiment, the gap filler agent composition includes the moiety represented by the above Chemical Formula 2. The hydrogenated polysiloxazane prepared according to the present example embodiment includes a silicon-oxygen-silicon (Si—O—Si) bond moiety as well as a silicon-nitrogen (Si—N) bond moiety in the structure. The silicon-oxygen-silicon (Si—O—Si) bond moiety may relieve stress during curing by heat treatment and may help decrease shrinkage.

In an implementation, the hydrogenated polysiloxazane has an oxygen content of about 0.2 to about 3 wt %. When it include an oxygen content within the range, a silicon-oxygen-silicon (Si—O—Si) bond in the structure may sufficiently relieve stress and help prevent shrinkage during the heat treatment, which may help reduce or eliminate cracks on a filler pattern.

In an implementation, the hydrogenated polysiloxazane may have an oxygen content ranging from, e.g., about 0.4 to about 2 wt %.

According to an example embodiment, the hydrogenated polysilazane or hydrogenated polysiloxazane included in the gap filler agent, as described above, may include a moiety of the following Chemical Formula 3 at a terminal end.

  [Chemical Formula 3]

According to the present example embodiment, the moiety represented by the above Chemical Formula 3 has a terminal end capped with hydrogen. In an implementation, the moiety may be included in an amount of about 15 to about 35% based on a total amount of Si—H bonds in the hydrogenated polysilazane or the hydrogenated polysiloxazane. When the moiety represented by the above Chemical Formula 3 is included in the hydrogenated polysilazane or hydrogenated polysiloxazane structure within the range, $SiH_3$ may be prevented from separating into $SiH_4$ during heat treatment, which may help prevent shrinkage and cracks on a filler pattern while an oxidation reaction is performed sufficiently.

According to an example embodiment, the hydrogenated polysilazane or hydrogenated polysiloxazane may have a weight average molecular weight (Mw) of about 1,000 to about 10,000. Within the above range, evaporating components may be reduced during the heat treatment and fine gaps of less than 50 nm may be filled densely.

In an implementation, the hydrogenated polysilazane or hydrogenated polysiloxazane may have a weight average molecular weight (Mw) of about 1,500 to about 7,000.

The hydrogenated polysilazane or the hydrogenated polysiloxazane may be dissolved in a suitable coating solvent to provide a solution or a composition for a semiconductor gap filler agent.

The coating solvent may be selected by considering conservation stability, a drying speed of the coating solution or the like, for example, an organic solvent having a boiling point of about 50 to 200° C. For example, an aromatic compound, an aliphatic compound, a saturated hydrocarbon compound, an ether, an ester, a ketone, and the like may be used. For example, the solvent may be benzene, toluene, xylene, ethylbenzene, diethylbenzene, trimethylbenzene, triethylbenzene, cyclohexane, cyclohexene, decahydronaphthalene, dipentene, pentane, hexane, heptane, octane, nonane, decane, ethylcyclohexane, methylcyclohexane, cyclohexane, cyclohexene, p-menthane, dipropylether, dibutylether, anisole, butyl acetate, amyl acetate, methylisobutylketone, or a combination thereof.

According to another example embodiment, a gap filler agent includes hydrogenated polysilazane or hydrogenated polysiloxazane prepared according to the method of the above embodiments.

The gap filler agent may include a hydrogenated polysilazane or hydrogenated polysiloxazane prepared by the method, in, e.g., an amount of about 0.1 to about 50 wt % based on the total amount of the gap filler agent. Within the range, the gap filler agent may be maintained within the appropriate viscosity, and may be formed smooth and flat without voids in gap fill.

The gap filler agent may further include a thermal acid generator (TAG).

The thermal acid generator may be an additive to improve developing property of the hydrogenated polysilazane or the hydrogenated polysiloxazane, and help the hydrogenated polysilazane or the hydrogenated polysiloxazane be developed at a relatively low temperature.

The thermal acid generator may include a suitable compound that generates acid ($H^+$) by heat. For example it may include a compound activated at 90° C. or higher and generating sufficient acid and also, having low volatility. Such a thermal acid generator may be, for example, nitrobenzyl tosylate, nitrobenzyl benzenesulfonate, phenol sulfonate, or a combination thereof.

The thermal acid generator may be included in an amount of about 0.01 to about 25 wt % based on the total amount of the gap filler agent. Within the range, the hydrogenated polysilazane or polysiloxazane may be developed at a low temperature and simultaneously have improved coating properties.

The gap filler agent may further include a surfactant.

The surfactant may include, for example, a non-ion-based surfactant of polyoxyethylene alkyl ethers such as polyoxyethylene lauryl ether, polyoxyethylene stearyl ether, polyoxyethylene cetyl ether, polyoxyethylene oleyl ether, and the like; polyoxyethylene alkylallyl ethers such as polyoxyethylene nonylphenolether, and the like; polyoxyethylene.polyoxypropylene block copolymers; polyoxyethylene sorbitan fatty acid ester such as sorbitan monolaurate, sorbitan monopalmitate, sorbitan monostearate, sorbitan monoleate, polyoxyethylene sorbitan monostearate, polyoxyethylene sorbitan trioleate, polyoxyethylene sorbitan tristearate, and the like; a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and the like; other silicone-based surfactant such as a organosiloxane polymer KP341 (Shin-Etsu Chemical Co., Ltd.), and the like.

The surfactant may be included in an amount of about 0.001 wt % to 10 wt % based on the total amount of the gap filler agent. Within the range, dispersion of a solution and, simultaneously, uniformity of a film thickness and filling properties may be improved.

All the components may be dissolved in a coating solvent to provide a solution.

The coating solvent may include one or more solvents, and may include a solvent having a high boiling point, which may help prevent void generation in a gap, and the solvent may volatilize slowly, which may enhance film flatness.

The solvent may be included in the balance other than the components based on the total amount of gap filler agent.

The gap filler agent may be used in providing an electrode during manufacturing a semiconductor capacitor, for example, the gap filler agent may be used to fill the gap of a mold for providing an electrode during manufacturing a semiconductor capacitor.

FIGS. 1 to 9 illustrate cross-sectional views of stages in a method of manufacturing a semiconductor capacitor according to an example embodiment.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

According to the present example embodiment, referring to FIG. 1, a mold oxide layer 3 is disposed on a semiconductor substrate 1. Disposed on the semiconductor substrate 1 may be a transistor (not shown), a contact pad (not shown), a contact plug (not shown), and the like. The mold oxide layer 3 may be made of, for example, an oxide such as silicon oxide ($SiO_2$), TEOS (tetraethylorthosilicate), BPSG (boron phosphorus silicate glass), and PSG (phosphor silicate glass), for example, in a chemical vapor deposition (CVD) method.

Figure 2:
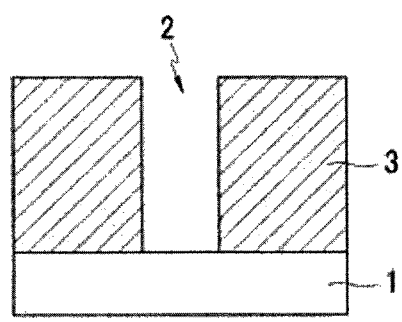

Referring to FIG. 2, a gap 2 revealing a contact plug on the semiconductor substrate 1 is formed by photolithography of the mold oxide layer 3. The gap 2 may be, e.g., less than 50 nm. It may have an aspect ratio of more than 1 between height and width.

Figure 3:
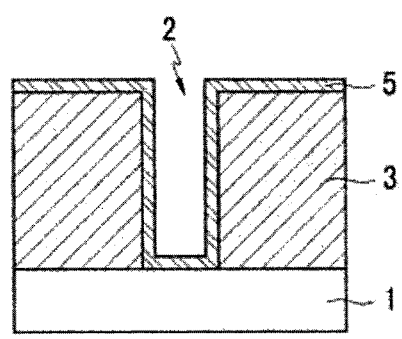

Referring to FIG. 3, a conductive layer 5 is laminated on the semiconductor substrate 1 and the mold oxide layer 3. The conductive layer 5 may be a single layer or multilayer. It may be made of, for example, a metal with low resistivity such as aluminum (Al), copper (Cu), silver (Ag), and an alloy thereof, a metal such as nickel (Ni), titanium (Ti), and the like, polysilicon, or the like. The conductive layer 5 may be formed in a sputtering or chemical vapor deposition (CVD) method, and the like.

Figure 4:
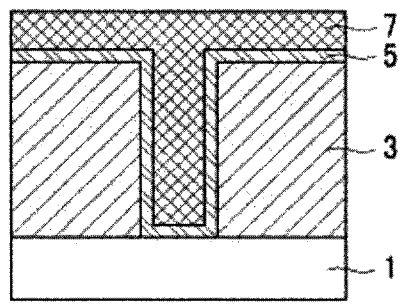

Referring to FIG. 4, on the conductive layer 5 is disposed a filler layer 7. The filler layer 7 may be a silica layer made from a gap filler agent including the hydrogenated polysilazane or hydrogenated polysiloxazane according to an embodiment.

According to an example embodiment, the hydrogenated polysilazane includes a moiety represented by the following Chemical Formula 1 in the structure, and the hydrogenated polysiloxazane includes the moiety represented by Chemical Formula 1 and a moiety represented by the following Chemical Formula 2.

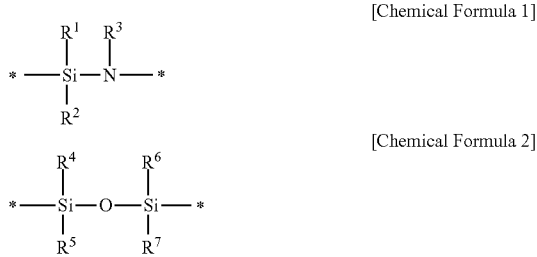

[Chemical Formula 1]

[Chemical Formula 2]

According to the present example embodiment, in the above Chemical Formulae 1 and 2, $R^1$ to $R^7$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof.

In an implementation, the hydrogenated polysiloxazane has an oxygen content of about 0.2 to 3 wt %. When oxygen is included within the range, a silicon-oxygen-silicon (Si—O—Si) bond in the structure may sufficiently relieve stress and prevent shrinkage during the heat treatment and help prevent cracks on a filler pattern, According to an example embodiment, the hydrogenated polysilazane or hydrogenated polysiloxazane includes a moiety of the following Chemical Formula 3 at the terminal end.

[Chemical Formula 3]

According to the present example embodiment, the moiety represented by the above Chemical Formula 3 has a terminal end capped with hydrogen. In an implementation, the moiety may be included in an amount of about 15 to 35% based on the total amount of a Si—H bond in the hydrogenated polysilazane or hydrogenated polysiloxazane structure. When the moiety represented by the above Chemical Formula 3 is included within the above range, $SiH_3$ may be prevented from separating into $SiH_4$ during the heat treatment, which may help prevent shrinkage and cracks on a filler pattern while an oxidation reaction is performed sufficiently.

In an implementation, the hydrogenated polysilazane or hydrogenated polysiloxazane may have a weight average molecular weight (Mw) of about 1,000 to about 10,000. When it has a weight average molecular weight (Mw) within the range, it may include less components evaporating during the heat treatment while filling a gap of less than 50 nm.

In an implementation, the hydrogenated polysilazane or hydrogenated polysiloxazane may have a weight average molecular weight (Mw) of about 1500 to about 7,000.

In an implementation, the hydrogenated polysilazane or hydrogenated polysiloxazane may be included in an amount of about 0.1 to about 50 wt % based on the total amount of gap filler agent. When it is included within the range, it may maintain appropriate viscosity and bring about flat and even gap-fill with no void.

The gap filler agent may include a coating solvent to provide a solution, and it may be coated in a solution method such as a spin coating.

Referring again to the example embodiment shown in FIG. 4, subsequently, the filler layer 7 is heat-treated. The heat-treating may be performed at about 200° C. or higher under vapor-containing atmosphere.

Figure 5:
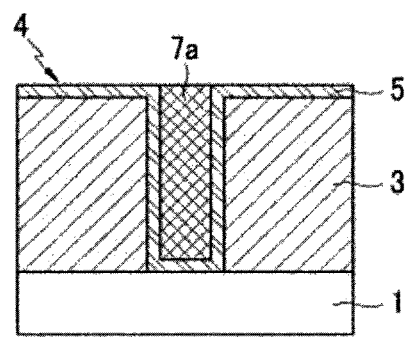

Referring to FIG. 5, the filler layer 7 may be developed using a developing solution.

Accordingly, the filler layer 7 disposed on the lower conductive layer 5 is removed, leaving a part filling the gap 2 and forming a predetermined filler pattern 7a.

Figure 6:
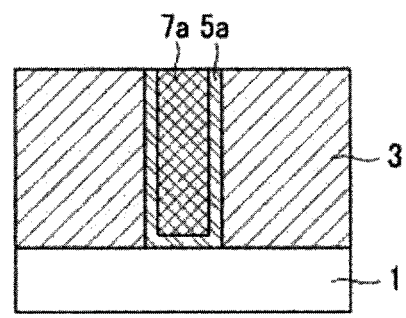

Referring to FIG. 6, the conductive layer 5 disposed on the mold oxide layer 3 is removed, leaving a part between the mold oxide layer 3 and the filler pattern 7a to separate a lower electrode 5a with a predetermined shape. Herein, the lower conductive layer 5 may be removed in a chemical mechanical polishing (CMP) method or an etch back method.

Figure 7:
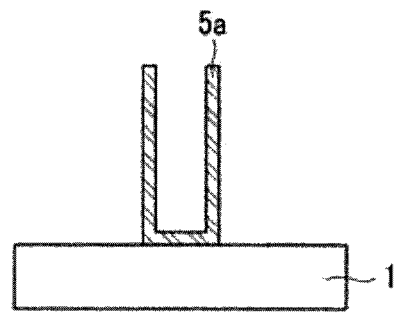

Referring to FIG. 7, the mold oxide layer 3 and the filler pattern 7a are simultaneously removed, leaving a lower electrode 5a. The mold oxide layer 3 and the filler pattern 7a are removed in a wet etching method. Herein, the wet etching may include a suitable material that simultaneously removes the mold oxide layer 3 and the filler pattern 7a. For example, it may include a fluorine-containing etching solution such as hydrofluoric acid (HF) and ammonium fluoride ($NH_4F$).

Figure 8:
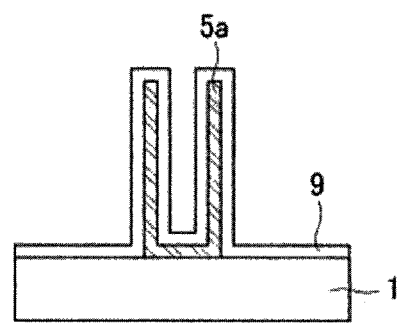

Referring to FIG. 8, a dielectric layer 9 is disposed on an entire surface of a substrate including a lower electrode 5a.

Figure 9:
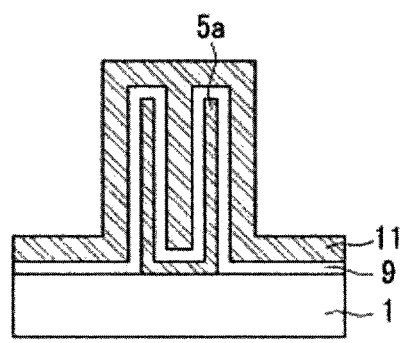

Referring to FIG. 9, an upper electrode 11 is formed by laminating a conductive layer on the dielectric layer 9 and then performing photolithography.

The lower electrode 5a, the dielectric layer 9, and the upper electrode 11 form a capacitor.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

The inside of a 2 L-capacity reactor equipped with an agitator and a temperature controller was purged with dry nitrogen. Then, 1,500 g of dry pyridine was added into the reactor and was kept at 5° C. Subsequently, 140 g of dichlorosilane was slowly added for 2 hours. With agitating, 85 g of ammonia was slowly added thereto over 28 hours. Then, dry nitrogen was injected for 120 minutes to remove ammonia remaining in the reactor.

The obtained white slurry product was filtered using a 1 μm TEFLON (tetrafluoroethylene) filter under the dry nitrogen atmosphere to provide 1,000 g of filtrate. 1,000 g of dry xylene was added thereto, and then the solvent of pyridine was replaced with xylene using a rotary evaporator, which was repeated for three times to adjust the solid concentration to 20%. It was filtered by TEFLON (tetrafluoroethylene) filter having a pore size of 0.1 μm. 250 g of dry pyridine was added into the obtained solution and polymerized at 100° C. to provide a hydrogenated polysilazane having a weight average molecular weight of 4,000 g/mol.

When completing the polymerization, the solvent was replaced with dibutylether using a rotary evaporator, which was repeated for three times at 30° C. to adjust the solid concentration with 20%, and it was filtered by 0.1 μm TEFLON (tetrafluoroethylene) filter to provide the hydrogenated polysilazane.

Example 2

The inside of a 2 L-capacity reactor equipped with an agitator and a temperature controller was purged with dry nitrogen. Then, 1,500 g of dry pyridine was added into the reactor and was kept at 5° C. Subsequently, 140 g of dichlorosilane was slowly added for 2 hours. With agitating, 85 g of ammonia was slowly added thereto over 9.5 hours. Then, dry nitrogen was injected for 120 minutes to remove ammonia remaining in the reactor. The obtained white slurry product was filtered using a 1 μm TEFLON (tetrafluoroethylene) filter under the dry nitrogen atmosphere to provide 1,000 g of filtrate.

1,000 g of dry xylene was added thereto, and then the solvent of pyridine was replaced with xylene using a rotary evaporator, which was repeated for three times, and the solid concentration was adjusted with 20%. It was filtered by TEFLON (tetrafluoroethylene) filter having a pore size of 0.1 μm. 250 g of dry pyridine was added into the obtained solution and polymerized at 100° C. to provide a hydrogenated polysilazane having a weight average molecular weight of 4,000 g/mol.

When completing the polymerization, the solvent was replaced with dibutylether using a rotary evaporator, which was repeated for three times at 30° C. to adjust the solid concentration with 20%, and it was filtered by 0.1 μm TEFLON (tetrafluoroethylene) filter to provide the hydrogenated polysilazane.

Comparative Example 1

The inside of a 2 L-capacity reactor equipped with an agitator and a temperature controller was purged with dry nitrogen. Then, 1,500 g of dry pyridine was added into the reactor and was kept at 0° C. Subsequently, 140 g of dichlorosilane was slowly added for 2 hours. With agitating, 85 g of ammonia was slowly added thereto over 5.4 hours. Then, dry nitrogen was injected for 120 minutes to remove ammonia remaining in the reactor.

The obtained white slurry product was filtered using a 1 μm TEFLON (tetrafluoroethylene) filter under the dry nitrogen atmosphere to provide 1,000 g of filtrate. 1,000 g of dry xylene was added thereto, and then the solvent of pyridine was replaced with xylene using a rotary evaporator, which was repeated for three times, and the solid concentration was adjusted with 20%. It was filtered by TEFLON (tetrafluoroethylene) filter having a pore size of 0.1 μm. 250 g of dry pyridine was added into the obtained solution and polymerized at 100° C. to provide a hydrogenated polysilazane having a weight average molecular weight with 4,000 g/mol.

When completing the polymerization, the solvent was replaced with dibutylether using a rotary evaporator, which was repeated for three times at 30° C. to adjust the solid concentration with 20%, and it was filtered by 0.1 μm TEFLON (tetrafluoroethylene) filter to provide the hydrogenated polysilazane.

Evaluation: Evaluating film thickness uniformity and film thickness shrinkage ratio of hydrogenated polysilazane film 3 cc of each hydrogenated polysilazane solution obtained from Example 1, Example 2, and Comparative Example 1 was dripped in the center of a wafer having a diameter of 8 inches and spin-coated at 1500 rpm for 20 seconds by a spin coater, and the coated hydrogenated polysilazane was measured for a film thickness using a thin film thickness measurement (ST-4000, manufactured by K-MAC).

Then, the coated wafer was heated and dried on a hot plate at 150° C. for 3 minutes, and the dried film was again measured for thickness using the reflective spectrophotometer film thickness tester.

The uniformity of film thickness was determined by the difference of film thickness between the center of wafer and the edge of wafer after drying the film.

In addition, the shrinkage ratio of film thickness was determined by dividing the film thickness difference in the wafer center between before and after the heating dry on a hot plate for 3 minutes by the film thickness in the wafer center before the dry heating. Thus, the shrinkage ratio of film thickness may be represented by the following Equation 1:

Shrinkage ratio of film thickness(%)={(film thickness before heating dry−film thickness after heating dry)/film thickness before heating dry}×100(%).  Equation 1

The measured film thickness uniformity and shrinkage ratio of film thickness after drying at a high temperature are shown in the following Table 1.

TABLE 1

|  | Film thickness uniformity (Å) | Shrinkage ratio of film thickness (%) |
| --- | --- | --- |
| Comparative Example 1 | 1,445 | 15.77 |
| Example 1 | 607 | 13.18 |
| Example 2 | 148 | 10.59 |

Referring to Table 1, Example 1 and Example 2 (adding ammonia over 9.5 hours or 28 hours) (slower than Comparative Example 1 adding ammonia in the equivalent amount over about 5.4 hours) had less film thickness difference between the center and the edge of film after the drying. Thus, when the hydrogenated polysilazane is prepared by adding ammonia within the specified range according to an embodiment, the film thickness after the drying may be formed to be more uniform.

In addition, for the shrinkage ratio of film thickness (determined by dividing the film thickness difference between the film thicknesses of before the heating dry and after the heating dry by the film thickness before the dry heating), Comparative Example 1 (adding ammonia over 5.4 hours) had a shrinkage ratio of 15.77%; on the other hand, Example 1 and Example 2 (adding ammonia over 9.5 hours and 28 hours, respectively), had shrinkage ratios of 13.18% and 10.59%. Thus, the hydrogenated polysilazane film manufactured by adding ammonia within the specified range according to an embodiment had a lower shrinkage ratio of film thickness after the dry heating.

By way of summation and review, as semiconductor technology is further developed, there is continuous research on forming highly-integrated and faster semiconductor memory cells that have improved performance and integrate smaller semiconductor chips. Among these, semiconductor memory cells, e.g., DRAM (dynamic random access memory), may be used. The DRAM is capable of freely inputting and outputting information, and may realize large capacity.

The DRAM may include, e.g., a plurality of unit cells including a MOS transistor (metal-oxide-semiconductor transistor) and a capacitor. The capacitor may include two electrodes and a dielectric layer disposed therebetween. The capacitor may have various capacities depending on, e.g., a dielectric constant, a thickness of the dielectric layer, an area of the electrodes, and the like.

As a size of a semiconductor chip is reduced, the size of the capacitor therein may also be reduced. However, sufficient storage capacity is desired from the smaller capacitor. The smaller capacitor may accomplish larger capacity by, e.g., increasing the vertical area while decreasing the horizontal area to increase overall active area. When a capacitor is formed in this way, a filler may be used to fill a mold and a gap thereon, so as to form an electrode that is relatively high compared with small horizontal area.

As described above, the gap filler agent including the obtained hydrogenated polysilazane may exhibit improved thickness uniformity and shrinkage ratio, and the film reactivity of a silica film by an oxidation reaction at a high temperature, by controlling the addition rate of ammonia while preparing the hydrogenated polysilazane or hydrogenated polysiloxazane.

An embodiment provides a method of preparing a gap filler agent, which may provide a uniform film thickness during coating, and exhibit a low shrinkage ratio during an oxidation reaction at a high temperature. Another embodiment provides a gap filler agent prepared by the method. The semiconductor gap filler agent prepared according to the present invention may prevent the shrinkage of silica film during curing into a silica film by an oxidation reaction at a high temperature, so that the filling properties to the gap having a narrow width may be improved. In addition, the filler may exhibit uniform film thickness on coating, and a semiconductor capacitor obtained therefrom may have has an improved surface flatness.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:
1. A method of preparing a gap filler agent, the method comprising:
adding a halosilane to a basic solvent; and
to the basic solvent and the halosilane, adding ammonia in an amount of about 50 to about 70 parts by weight based on 100 parts by weight of the halosilane at a rate of about 1 g/hr to about 15 g/hr, wherein:
the gap filler agent includes a hydrogenated polysiloxazane formed from the halosilane, and the hydrogenated polysiloxazane includes a moiety represented by the following Chemical Formula 1 and a moiety represented by the following Chemical Formula 2:

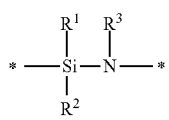

[Chemical Formula 1]

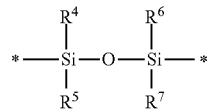

[Chemical Formula 2]

wherein, in Chemical Formulae 1 and 2, $R^1$ to $R^7$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof.

2. The method as claimed in claim 1, wherein the ammonia is added at a rate of about 2 g/hr to about 9 g/hr.

3. The method as claimed in claim 1, wherein the ammonia is added at a rate of about 3 g/hr to about 7 g/hr.

4. The method as claimed in claim 1, wherein the halosilane includes one or more of $RSiX_3$, $R_2SiX_2$, or $R_3SiX$, wherein each R is independently selected from hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, and a combination thereof, provided that at least one R of the halosilane is hydrogen, and each X is independently a halogen atom.

5. The method as claimed in claim 1, wherein the basic solvent has a basic amine group and includes one or more of trimethylamine, dimethylethylamine, diethylmethylamine, triethylamine, pyridine, picoline, dimethylaniline, trimethylphosphine, dimethylethylphosphine, methyldiethylphosphine, triethylphosphine, trimethylarsine, trimethylstibine, or triazine.

6. The method as claimed in claim 1, wherein the hydrogenated polysiloxazane includes a moiety represented by the following Chemical Formula 3 at a terminal end in an amount of about 15 to about 35% based on the total amount of Si—H bonds in the hydrogenated polysiloxazane structure:

 [Chemical Formula 3].

7. The method as claimed in claim 1, wherein the hydrogenated polysiloxazane has a weight average molecular weight (Mw) of about 1,000 to about 10,000.

8. The method as claimed in claim 1, wherein the hydrogenated polysiloxazane has an oxygen content of about 0.2 to about 3 wt %.

9. A method of manufacturing a semiconductor capacitor, the method comprising:
providing a mold having a gap on a semiconductor substrate;
providing a conductive layer on the semiconductor substrate and the mold;
coating a gap filler agent on the gap and the conductive layer to provide a filler layer;
heat-treating the filler layer;
developing a part of the filler layer to provide a filler pattern filled in the gap;

removing a part of the conductive layer to separate a plurality of the first electrodes;
removing the mold and the filler pattern;
providing a dielectric layer on the first electrode; and
providing a second electrode on the dielectric layer,
wherein the gap filler agent is prepared by the method as claimed in claim 1.

10. A method of preparing a gap filler agent, the method comprising:
adding a halosilane to a basic solvent; and
to the basic solvent and the halosilane, adding ammonia in an amount of about 50 to about 70 parts by weight based on 100 parts by weight of the halosilane at a rate of about 1 g/hr to about 15 g/hr,
wherein the gap filler agent includes a hydrogenated polysilazane formed from the halosilane, and the hydrogenated polysilazane includes a moiety represented by the following Chemical Formula 1:

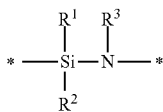

[Chemical Formula 1]

wherein $R^1$ to $R^3$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and
wherein the hydrogenated polysilazane includes a moiety represented by the following Chemical Formula 3 at a terminal end in an amount of about 15 to about 35% based on the total amount of Si—H bonds in the hydrogenated polysilazane structure:

 [Chemical Formula 3].

11. The method as claimed in claim 10, wherein the hydrogenated polysilazane has a weight average molecular weight (Mw) of about 1,000 to about 10,000.

12. A method of manufacturing a semiconductor capacitor, the method comprising:
providing a mold having a gap on a semiconductor substrate;
providing a conductive layer on the semiconductor substrate and the mold;
coating a gap filler agent on the gap and the conductive layer to provide a filler layer;
heat-treating the filler layer;
developing a part of the filler layer to provide a filler pattern filled in the gap;
removing a part of the conductive layer to separate a plurality of the first electrodes;
removing the mold and the filler pattern;
providing a dielectric layer on the first electrode; and
providing a second electrode on the dielectric layer,
wherein the gap filler agent is prepared by the method as claimed in claim 10.

13. A method of preparing a gap filler agent, the method comprising:
adding a halosilane to a basic solvent;
to the basic solvent and the halosilane, adding ammonia in an amount of about 50 to about 70 parts by weight based on 100 parts by weight of the halosilane at a rate of about 1 g/hr to about 15 g/hr;
removing a halogen ammonium salt generated from the halosilane; and
polymerizing the halogen ammonium salt to provide a hydrogenated polysilazane.

14. A method of manufacturing a semiconductor capacitor, the method comprising:
providing a mold having a gap on a semiconductor substrate;
providing a conductive layer on the semiconductor substrate and the mold;
coating a gap filler agent on the gap and the conductive layer to provide a filler layer;
heat-treating the filler layer;
developing a part of the filler layer to provide a filler pattern filled in the gap;
removing a part of the conductive layer to separate a plurality of the first electrodes;
removing the mold and the filler pattern;
providing a dielectric layer on the first electrode; and
providing a second electrode on the dielectric layer,
wherein the gap filler agent is prepared by the method as claimed in claim 13.

15. A method of preparing a gap filler agent, the method comprising:
adding a halosilane to a basic solvent;
to the basic solvent and the halosilane, adding ammonia in an amount of about 50 to about 70 parts by weight based on 100 parts by weight of the halosilane at a rate of about 1 g/hr to about 15 g/hr; wherein a predetermined amount of water is included in the basic solvent, and the method further comprises:
removing a halogen ammonium salt generated from the halosilane; and
polymerizing the halogen ammonium salt to provide a hydrogenated polysiloxazane.

16. A method of manufacturing a semiconductor capacitor, the method comprising:
providing a mold having a gap on a semiconductor substrate;
providing a conductive layer on the semiconductor substrate and the mold;
coating a gap filler agent on the gap and the conductive layer to provide a filler layer;
heat-treating the filler layer;
developing a part of the filler layer to provide a filler pattern filled in the gap;
removing a part of the conductive layer to separate a plurality of the first electrodes;
removing the mold and the filler pattern;
providing a dielectric layer on the first electrode; and
providing a second electrode on the dielectric layer,
wherein the gap filler agent is prepared by the method as claimed in claim 15.

* * * * *